United States Patent
Gallagher

(10) Patent No.: US 6,573,757 B1
(45) Date of Patent: Jun. 3, 2003

(54) SIGNAL LINE MATCHING TECHNIQUE FOR ICS/PCBS

(75) Inventor: Kevin J. Gallagher, Carrigtwohill (IE)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/658,598

(22) Filed: Sep. 11, 2000

(51) Int. Cl.$^7$ ................................ H03K 19/00
(52) U.S. Cl. .................. 326/101; 326/47; 327/297; 327/295; 713/401; 716/6
(58) Field of Search ................ 326/47, 101; 327/297; 713/401; 716/6

(56) References Cited

U.S. PATENT DOCUMENTS

| | | | |
|---|---|---|---|
| 4,419,739 A | 12/1983 | Blum | 364/900 |
| 4,482,826 A | 11/1984 | Ems et al. | 307/602 |
| 4,503,490 A | 3/1985 | Thompson | 364/200 |
| 4,694,403 A | 9/1987 | Nomura | 364/488 |
| 4,714,924 A | 12/1987 | Ketzler | 340/825.21 |
| 4,812,684 A | 3/1989 | Yamagiwa et al. | 307/480 |
| 4,926,066 A | 5/1990 | Maini et al. | 307/303.1 |
| 5,010,493 A | 4/1991 | Matsumoto et al. | 364/490 |
| 5,077,676 A | 12/1991 | Johnson et al. | 364/489 |
| 5,109,168 A | 4/1992 | Rusu | 307/480 |
| 5,140,184 A | 8/1992 | Hamamoto et al. | 307/303.1 |
| 5,172,330 A | 12/1992 | Watanabe | 364/491 |
| 5,235,521 A | 8/1993 | Johnson et al. | 364/489 |
| 5,239,215 A | 8/1993 | Yamaguchi | 307/480 |
| 5,293,626 A | 3/1994 | Priest et al. | 395/550 |
| 5,339,253 A | 8/1994 | Carrig et al. | 364/489 |
| 5,402,356 A * | 3/1995 | Schaefer et al. | 364/489 |
| 5,410,491 A | 4/1995 | Minami | 364/491 |
| 5,519,351 A | 5/1996 | Matsumoto | 327/295 |
| 5,557,779 A | 9/1996 | Minami | 395/500 |
| 5,686,845 A * | 11/1997 | Erdal et al. | 326/93 |
| 5,691,662 A | 11/1997 | Soboleski et al. | 327/292 |
| 5,784,600 A | 7/1998 | Doreswamy et al. | 395/558 |
| 5,831,459 A * | 11/1998 | McDonald | 327/141 |
| 5,838,581 A | 11/1998 | Kuroda | 364/491 |
| 5,849,610 A | 12/1998 | Zhu | 438/129 |
| 5,963,728 A | 10/1999 | Hathaway et al. | 395/500.04 |
| 6,006,025 A | 12/1999 | Cook et al. | 395/500.15 |
| 6,088,254 A * | 7/2000 | Kermani | 365/63 |
| 6,204,713 B1 * | 5/2001 | Adams et al. | 327/295 |
| 6,353,352 B1 * | 5/2002 | Sharpe-Geisler | 327/295 |

* cited by examiner

Primary Examiner—Don Le
Assistant Examiner—Vibol Tan
(74) Attorney, Agent, or Firm—Christopher P. Maiorana, P.C.

(57) ABSTRACT

An apparatus comprising an output connected to a plurality of inputs through a tree of connections. Each of one or more branches of the tree may be equidistant between the output and each of the plurality of inputs.

17 Claims, 6 Drawing Sheets

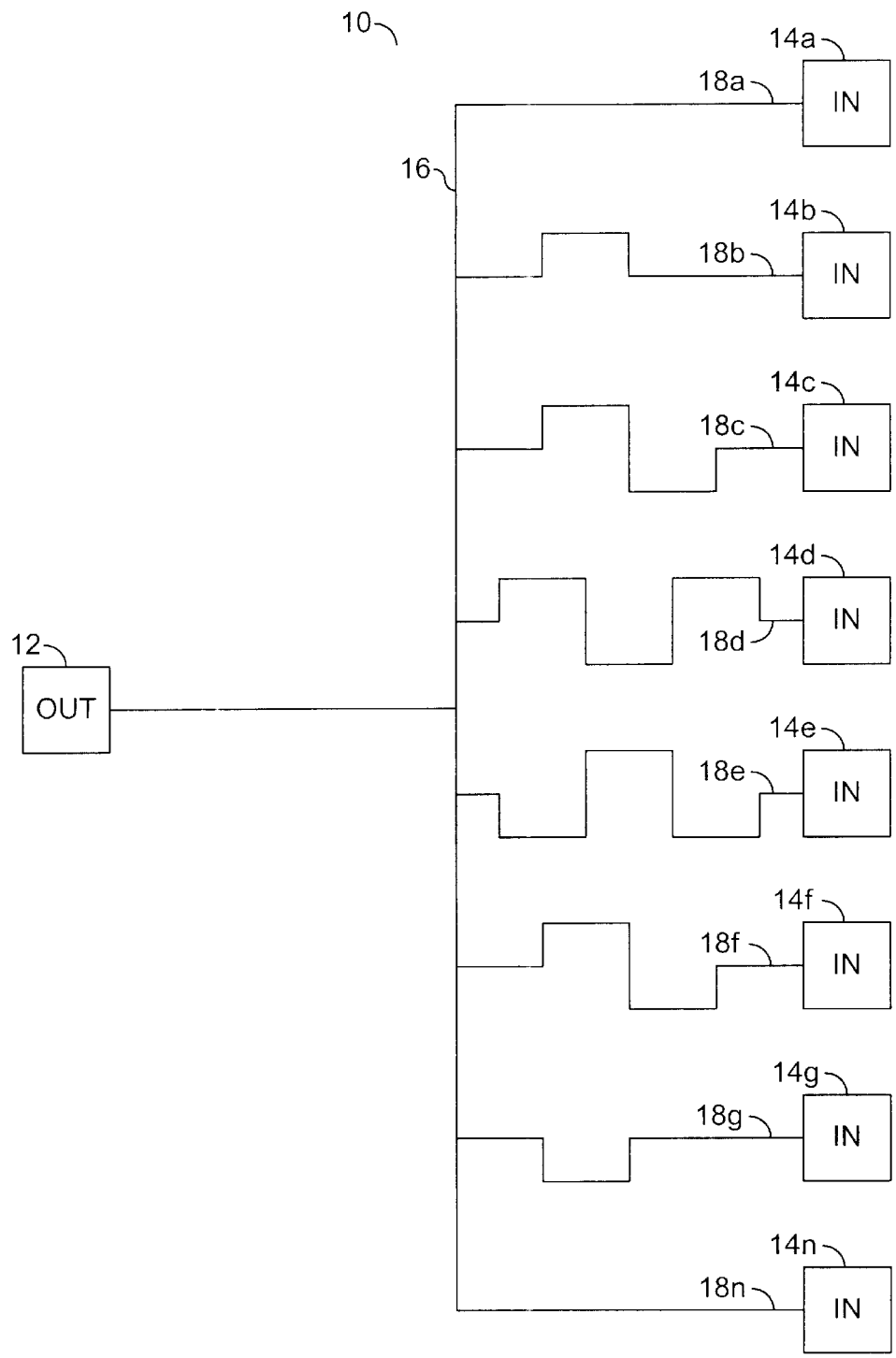
(CONVENTIONAL)
FIG. 1

US 6,573,757 B1

SIGNAL LINE MATCHING TECHNIQUE FOR ICS/PCBS

FIELD OF THE INVENTION

The present invention relates to a method and/or architecture for signal matching generally and, more particularly, to a method and/or architecture for signal matching in integrated circuits (ICs) and/or printed circuit boards (PCBs).

BACKGROUND OF THE INVENTION

Referring to FIG. 1, a diagram of a conventional system 10 for signal line matching is shown. The system 10 generally comprises an output pin 12 and a number of input pins 14a–14n. Each of the input pins is connected to a common trace 16 by a number of traces 18a–18n. To compensate for various board layouts, the various traces 18a–18n may be implemented in a variety of manners such as a meander (or serpentine) and/or other manners. For example, the trace 18a is farther from the output pin 12 than, for example, the trace 18d. For the entire distance between the output pin 12 to the input pin 14d to be equal to the other traces 18a–18n, the trace 18d must be made longer, by adding additional trace length (i.e., the meander sections). The meander sections of the traces 18a–18n provide a generic distance from the output pin 12 to each of the input pins 14a–14n, respectively.

Another conventional approach for signal line matching is disclosed by U.S. Pat. No. 4,812,684. The conventional approach of U.S. Pat. No. 4,812,684 discloses a scheme implementing a number of intermediate buffers. However, such intermediate buffers add considerable additional circuit design.

Another conventional approach for signal line matching is disclosed by U.S. Pat. No. 5,109,168. The conventional approach of U.S. Pat. No. 5,109,168 discloses a number of signal lines that are split architecturally. Since the signals turn 90 degrees and tend to form a loop, increased inductance can be experienced. Increased inductance can limit high frequency operation and can create ground bounce according to the equation $L*di/dt$, where i is current and t is time. Since low inductance is important for high frequency applications, the split architecture approach is not ideal.

Another conventional approach for signal line matching is disclosed by U.S. Pat. No. 5,410,491. The conventional approach of U.S. Pat. No. 5,410,491 implements complicated algorithms to balance various branches. Such an implementation increases complexity and associated errors. Additionally, U.S. Pat. No. 5,410,491 is similar to U.S. Pat. No. 5,109,168 and requires additional circuitry.

Conventional methods of matching signal lines can be performed by meandering tracks to match physical lengths of signal lines or by adding stubs to match capacitances of variable length signal lines. The meanders are implemented to keep distance from the output pin 12 to each of the input pins 14a–14n identical. The conventional meanders and/or addition of stubs is time consuming, untidy and is not methodical.

It is therefore desirable to provide a signal matching device that may be implemented with low inductance, which may enable high frequency chips, such as clock chips with tight skew parameters and/or specifications to be implemented properly. Additionally, low inductance may also reduce setting times of the output signals.

SUMMARY OF THE INVENTION

The present invention concerns an apparatus comprising an output connected to a plurality of inputs through a tree of connections. Each of one or more branches of the tree may be equidistant between the output and each of the plurality of inputs.

The objects, features and advantages of the present invention include providing a method and/or architecture for signal matching in integrated circuits (ICs) and/or printed circuit boards (PCBs) that may (i) implement meanders to keep all signal paths equidistant, (ii) match signal lines to any number of inputs from a single output, (iii) implement splits that travel an equal distance before they split again to guarantee equidistant lines, and/or (iv) implement all lines in a methodical manner, ensuring clarity, ease of construction and saving production time.

BRIEF DESCRIPTION OF THE DRAWINGS

These and other objects, features and advantages of the present invention will be apparent from the following detailed description and the appended claims and drawings in which:

FIG. 1 is a block diagram of a conventional architecture for matching signal lines;

DETAILED DESCRIPTION OF THE PREFERRED EMBODIMENTS

Figure 2:
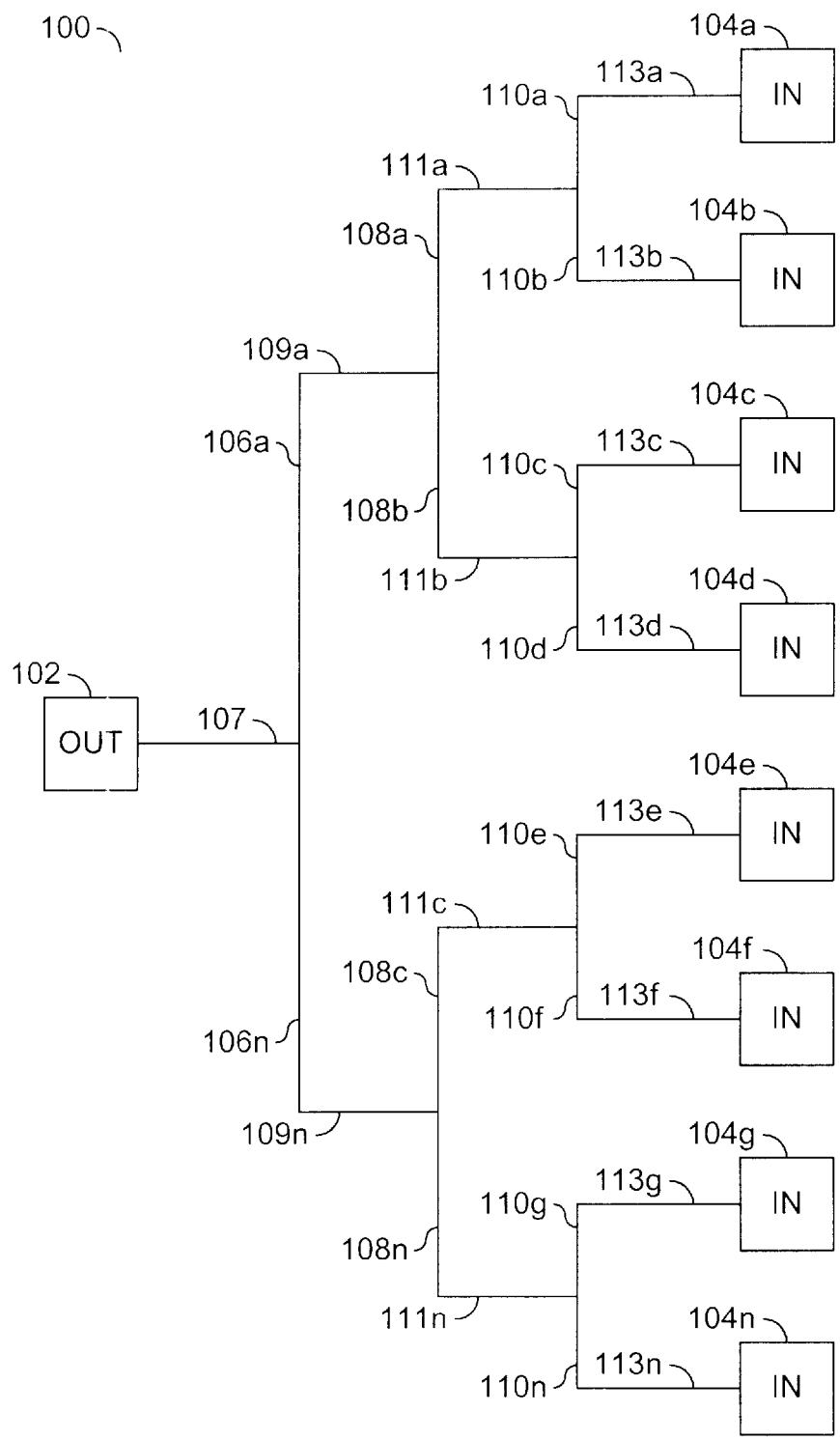
FIG. 2 is a preferred embodiment of the present invention.

Referring to FIG. 2, a block diagram of a system 100 is shown in accordance with a preferred embodiment of the present invention. With signal frequencies increasing consistently in ICs and PCBs, the requirement for matching of critical signal lines is becoming important. The present invention may be implemented to easily match such signal lines.

The system 100 generally comprises an output pin 102 and a number of input pins 104a–104n, where n is an integer. The output pin 102 is generally connected to a number of branches 106a–106n through a branch 107. The branches 106a–106n may be connected to a number of branches 108a–108n through a number of branches 109a–109n. The branches 108a–108n may be connected to a number of branches 110a–110n through a number of branches 111a–111n. The branches 110a–110n may be connected to the input pins 104a–104n through a number of branches 113a–113n. The branches 106a and 106n are generally of an equal distance. Similarly, the branches 108a–108n may be of equal distance, and the branches 110a–110n may be of equal distance. Similarly, the branches 109a–109n, the branches 111a–111n and the branches 113a–113n are also generally of equal distance. The circuit 100 may implement another appropriate number of branches in order to meet the criteria of a particular implementation. For example, an appropriate number of branches may allow for a specified number of input pins (as best shown in connection with FIGS. 3(a–h)).

The system 100 may construct signal lines of equal distance from the output 102 of one circuit to any number of inputs 104a–104n. Depending on how many inputs 104a–104n the output 102 is required to drive, the signal line may split into a number of paths. The circuit 100 may be extended to drive an appropriate number of inputs, even or odd. The circuit 100 may provide a methodical, neat, clear, and easy to develop, method for signal line matching that may save production time. The circuit 100 may also be easy to check visually that all paths from an output to an input are equidistant, in contrast to conventional applications that implement meanders and/or stubs. Additionally, the circuit 100 may provide matched resistance, capacitance and/or inductance of signal lines.

The present invention may also be implemented as a method for generating equidistant lines from the output 102 of one circuit to any number of inputs 104a–104n. The signal line 107 may be split into a tree-like structure with enough "branches" for the required number of inputs 104a–104n. The tree structure of the present invention is methodical, neat, clear, tidy, easy to develop and may save time and money during development stages.

Referring to FIGS. 3(a–h), detailed example implementations of the present invention are shown. When a number of input pins is $2^n$, where $N \geq 1$ (e.g., 2, 4, 8, 16, 32, etc.), then a tree structure may be easily constructed. Referring to FIG. 3a, a detailed block diagram is shown illustrating a two input tree structure. Referring to FIG. 3b, a detailed block diagram is shown illustrating a four input tree structure. Referring to FIG. 3c, a detailed block diagram is shown illustrating an eight input tree structure. Referring to FIG. 3d, a detailed block diagram is shown illustrating a sixteen input tree structure. The tree structures of FIGS. 3(a–d) provide matched resistance, capacitance and inductance for all signal lines.

Figure 3A:
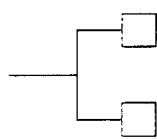
FIGS. 3(a–h) are example variations of the present invention.
Figure 3B:
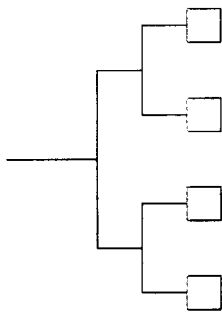
Figure 3C:
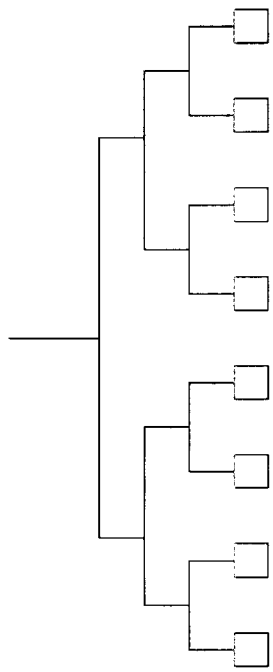
Figure 3D:
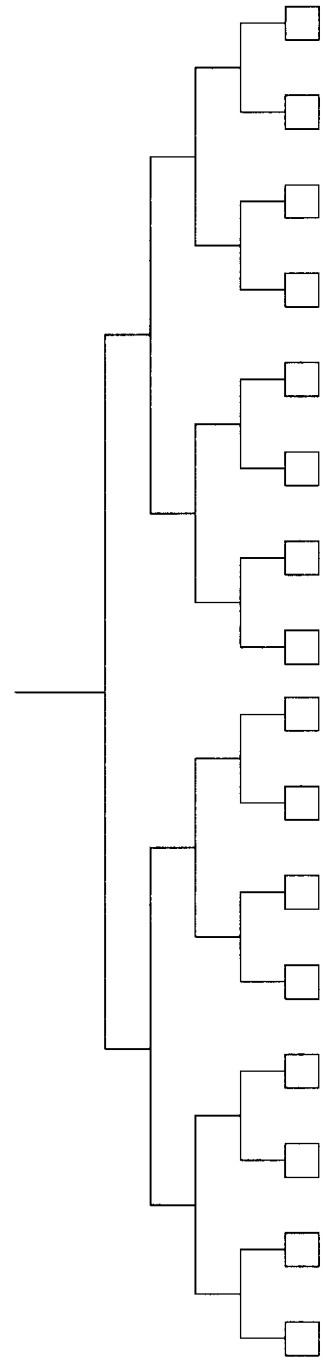
Figure 3E:
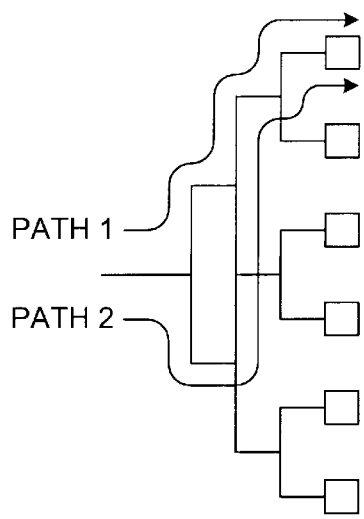
Figure 3G:
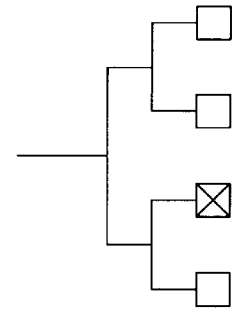
Figure 3F:
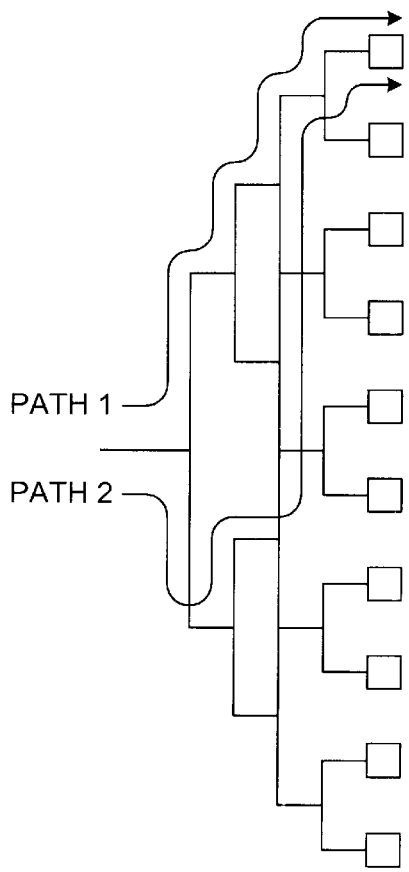

When the number of inputs is not a power of two, but remains even, the tree structure may be slightly modified. Referring to FIG. 3e, a detailed block diagram is shown illustrating a six input tree structure. Referring to FIG. 3f, a detailed block diagram is shown illustrating a ten input tree structure. The trees of FIGS. 3 (e–f) provide matched resistance, capacitance and inductance for all signal lines.

Figure 3H:
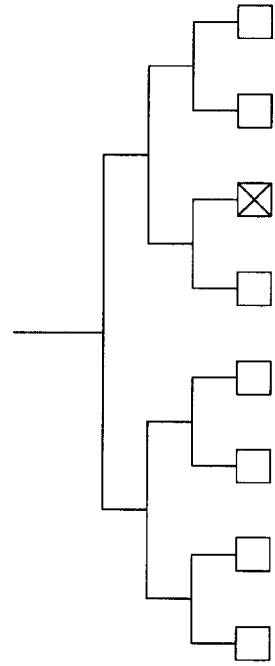

When the number of inputs is odd, the architecture may again be slightly modified. For a particular number of odd inputs M, the tree structure may be implemented for a M+1 tree structure. The M+1 tree structure may implement a single input pin as a dummy input. Referring to FIG. 3g, a detailed block diagram is shown illustrating a three input tree structure with a dummy input marked with an X. Referring to FIG. 3h, a detailed block diagram is shown illustrating a seven input tree structure with a dummy input marked with an X. The dummy input X may be implemented to provide matched resistance, capacitance and inductance between the signal lines. If there are an odd number of cells/circuits to drive, then only a front end of a cell may need to be placed at the end of the branch in order to match load capacitances. The dummy input may only be necessary as a front end of the input cell/circuit when there are an odd number of cells/circuits to drive. No dummy inputs are required when the number of cells/circuits is even. For example, if two devices are coupled to a particular branch and one device to the opposing branch, a mismatch condition may occur. The exemplary tree structures of FIGS. 3(a–h) may not be required to implement stubs, meanders, and/or other conventional signal matching techniques as discussed in the background section.

Figure 4:
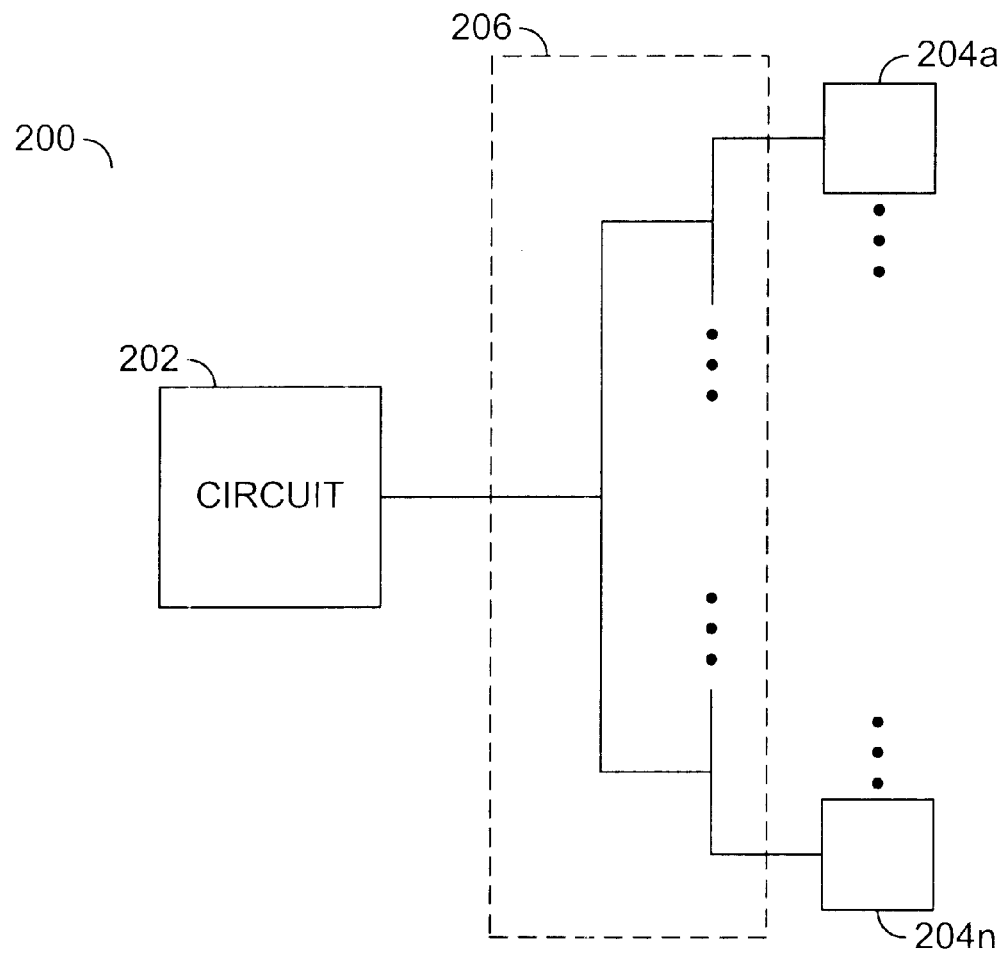
FIG. 4 is a block diagram of an implementation of the present invention.

Referring to FIG. 4, a system (or circuit) 200 is shown illustrating an implementation of the present invention. The system 200 generally comprises a circuit 202, a number of inputs 204a–204n (where n is an integer) and a tree structure 206. The tree structure 206 may allow an output of the circuit 202 to be presented to any number of inputs (e.g., the inputs 204a–204n). Additionally, the tree structure 206 may provide matched resistance, capacitance and inductance along a number of signal lines to the inputs 204a–204n.

Figure 5:
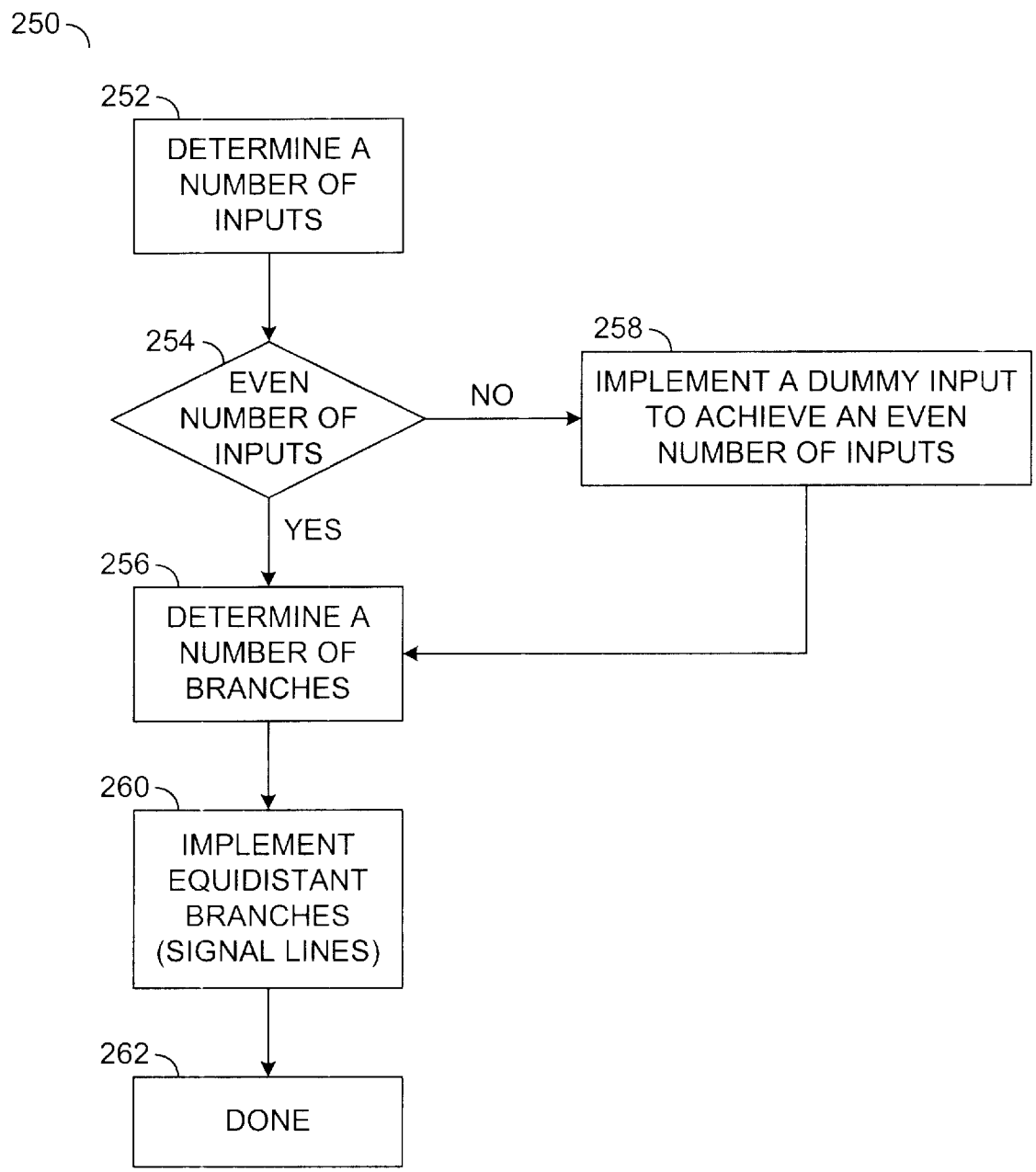
FIG. 5 is a flow chart illustrating an operation of the present invention.

Referring to FIG. 5, a block diagram of a system (or method) 250 is shown. The system 250 may illustrate an operation of the present invention. Specifically, the system 250 may illustrate implementation of equidistant signal lines. The system 250 generally comprises a state 252, a decision state 254, a state 256, a state 258 a state 260 and a done state 262.

The state 252 may determine a number of inputs to drive. The state 252 may then continue to the decision state 254. The decision state 254 may determine if the number of inputs is even. If the number of inputs is even, the system 250 may continue to the state 256. If the number of inputs is not even (e.g., odd), the system 250 may continue to the state 258. The state 258 may implement a dummy input to achieve an even number of inputs. The state 258 may then continue to the state 256. The state 256 may determine a number of required branches. The state 256 may then continue to the state 260. The state 260 may implement the branches that are generally equidistant. Additionally, the branches may be implemented as equidistant signal lines. The state 260 may then continue to the done state 262.

The function performed by the system of FIG. 5 may be implemented using a conventional general purpose digital computer programmed according to the teachings of the present specification, as will be apparent to those skilled in the relevant art (s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

The present invention may provide a layout technique for matching of analog signals within an IC or on a PCB. The circuit 100 may not be required to be constructed precisely as presented. However, the present invention may be required to implement equidistant distances along each split. The circuit 100 may provide a methodical manner in which multiple equidistant signal lines from an output to multiple inputs are constructed.

The circuit 100 may provide signal line paths that may be equidistant. The circuit 100 may be implemented to match signal lines to any number of inputs from a single output. The circuit 100 may allow each split to travel an equal distance before splitting again. The circuit 100 may guarantee equidistant lines. The circuit 100 may provide method signal lines that may be constructed in a methodical manner ensuring clarity and ease of construction, saving time.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

an output connected to a plurality of inputs each along at least two paths through a tree of connections, wherein each of a plurality of branches of said tree is (i) equidistant between said output and each of said plurality of inputs, (ii) provides matched inductance in each branch and (iii) at least one of said inputs comprises a dummy input.

2. The apparatus according to claim 1, wherein each of said plurality of branches have an equal length.

3. The apparatus according to claim 1, wherein said plurality of inputs comprises an odd number of inputs.

4. The apparatus according to claim 1, wherein said apparatus comprises an integrated circuit (IC).

5. The apparatus according to claim 1, wherein said apparatus comprises a printed circuit board (PCB).

6. The apparatus according to claim 1, wherein said plurality of branches provide matched resistance.

7. The apparatus according to claim 1, wherein said plurality of branches provide matched capacitance.

8. The apparatus according to claim 1, wherein said plurality of inputs comprise input pins.

9. The apparatus according to claim 1, wherein said inductance in each of said branches is minimized.

10. An apparatus comprising:

means for coupling an output to a plurality of inputs each along at least two paths, wherein at least one of said inputs comprises a dummy input; and means for (i) configuring equidistant branches between said plurality of inputs and said output and (ii) providing matched inductance in each of said branches.

11. A method for providing signal line matching, comprising the steps of:

(A) determining a number of inputs, wherein at least one of said inputs comprises a first dummy input; and (B) implementing a plurality of equidistance branches between an output and a plurality of inputs each along at least two paths, wherein each of said branches has a matched inductance.

12. The method according to claim 11, further comprising the step of:

(C) determining if said number of inputs is even.

13. The method according to claim 12, wherein step (C) further comprises:

if said number is even implementing a second dummy input.

14. The method according to claim 11, wherein step (B) further comprises determining a number of equidistant branches.

15. The method according to claim 11, wherein step (B) further comprises:

providing each branch with a matched resistance.

16. The method according to claim 11, wherein step (B) further comprises:

providing each branch with a matched capacitance.

17. A computer readable medium configured to store instructions for executing the steps of claim 11.

* * * * *